United States Patent
Chan et al.

(10) Patent No.: US 6,410,985 B1
(45) Date of Patent: Jun. 25, 2002

(54) SILVER METALLIZATION BY DAMASCENE METHOD

(75) Inventors: Tsiu C. Chan, Carrollton; Anthony M. Chiu, Richardson; Gregory C. Smith, Carrolton, all of TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/563,958

(22) Filed: May 2, 2000

Related U.S. Application Data

(62) Division of application No. 09/102,431, filed on Jun. 22, 1998, now Pat. No. 6,100,194.

(51) Int. Cl.$^7$ .......................... H01L 23/48; H01L 23/52; H01L 29/40
(52) U.S. Cl. .......................... 257/762; 257/751; 257/753; 257/765
(58) Field of Search ................................ 257/762, 751, 257/753, 765

(56) References Cited

U.S. PATENT DOCUMENTS

| | | | |
|---|---|---|---|
| 3,686,698 A | * | 8/1972 | Akeyama et al. |
| 3,808,470 A | * | 4/1974 | Kniepkamp |
| 5,627,102 A | * | 5/1997 | Shinriki et al. |
| 5,645,628 A | * | 7/1997 | Endo et al. ................. 106/1.23 |
| 5,705,230 A | * | 1/1998 | Matanabe et al. .......... 427/438 |
| 5,723,028 A | * | 3/1998 | Poris ........................... 204/231 |
| 5,739,579 A | * | 4/1998 | Chiang et al. ............... 257/635 |
| 5,763,953 A | * | 6/1998 | Iijima et al. ................. 257/762 |

* cited by examiner

*Primary Examiner*—Ngân V. Ngô
(74) *Attorney, Agent, or Firm*—Lisa K. Jorgenson; Daniel E. Venglarik

(57) ABSTRACT

Silver interconnects are formed by etching deep grooves into an insulating layer over the contact regions, exposing portions of the contact regions and defining the interconnects. The grooves are etched with a truncated V- or U-shape, wider at the top than at any other vertical location, and have a minimum width of 0.25 µm or less. An optional adhesion layer and a barrier layer are sputtered onto surfaces of the groove, including the sidewalls, followed by sputter deposition of a seed layer. Where aluminum is employed as the seed layer, a zincating process may then be optionally employed to promote adhesion of silver to the seed layer. The groove is then filled with silver by plating in a silver solution, or with silver and copper by plating in a copper solution followed by plating in a silver solution. The filled groove which results does not exhibit voids ordinarily resulting from sputter deposition of metal into such narrow, deep grooves, although seams may be intermittently present in portions of the filled groove where metal plated from the opposing sidewalls did not fuse flawlessly at the point of convergence. Portions of the silver and other layers above the insulating material are then removed by chemical-mechanical polishing, leaving a silver interconnect connected to the exposed portion of the contact region and extending over adjacent insulating regions to another contact region or a bond pad. Silver interconnects thus formed may have smaller cross-sections, and thus a greater density in a given area, than conventional metallic interconnects.

26 Claims, 7 Drawing Sheets

SILVER METALLIZATION BY DAMASCENE METHOD

This is a Division of application Ser. No. 09/102,431, filed Jun. 22, 1998, now U.S. Pat. No. 6,100,194.

BACKGROUND OF THE INVENTION

1. Field of the Invention

The present invention relates generally to the formation of integrated circuit interconnect structures, and more specifically to a technique for forming silver metal interconnects within integrated circuit devices. The technique is particularly adapted for use with very small device geometries.

2. Description of the Prior Art

As device geometries within integrated circuits shrink, interconnect—conductive lines connecting devices to each other and to input and output pads—are becoming an obstacle to achieving greater device densities. In order to fit a larger number of devices on the same size die or on a smaller die, a larger number of interconnects must also be formed within a given area, and must continue to effectively conduct signals across relatively substantial distances on the die. Since interconnects typically run parallel to each other on a given metallization level, either the interconnect size (width or cross-sectional area) or the distance between adjacent interconnects, or both, must be reduced to increase the number of interconnects which may fit on a fixed-size die for carrying signals between devices. Reducing an interconnect's width or cross-sectional area increases the resistance of the interconnect, requiring larger voltages and/or currents to drive signals carried by the interconnects. Reducing the distance between adjacent interconnects creates a greater potential for capacitive coupling and signal errors.

One approach to increasing the number of interconnects which may be formed in a given area involves utilizing lower resistivity metals. Interconnects are typically formed of aluminum, which has a resistivity of about 2.7 $\mu\Omega$cm. By utilizing lower resistivity metals, such as copper (1.7–1.8 $\mu\Omega$-cm) or silver (1.2–1.5 $\mu\Omega$-cm), inter-connects with smaller widths and cross-sectional areas could be formed without increasing the total resistance of the interconnect. Thus, a larger number of inter-connects could be formed within a given area without impacting performance.

Unfortunately, some lower resistivity metals are incompatible with existing techniques for forming interconnects. A typical process for forming aluminum metal or aluminum alloy interconnects in accordance with the known art is depicted in FIGS. 5A through 5D. Current technology in metallization of integrated circuits involves forming an aluminum metal or alloy layer 502 over substrate 504 including devices and device contacts 506 formed through one or more dielectric layers 508, 510 over the devices, as depicted in FIG. 5A. In the embodiment depicted, dielectric 508 is a conformal dielectric layer such as an undoped oxide formed by chemical vapor deposition, while dielectric 510 is a spin-on glass. Contacts 506 may be formed of various materials such as tungsten or tungsten and polysilicon in the contact holes.

Aluminum layer 502 is then patterned by forming a photoresist layer over aluminum layer 502 and exposing and developing the photoresist to leave patterned resist lines 512, as illustrated in FIG. 5B. Aluminum layer 502 is then plasma etched with resist lines 512 in place to remove those portions of aluminum layer 502 which are not protected by resist lines 512, leaving interconnects 514 as depicted in FIG. 5C. Interconnects 514 are shown in cross-section in FIG. 5C, but may extend for substantial distances over the die to another contact or input/output pad (not shown). Photoresist lines 512 are then removed, and a dielectric layer 516 is deposited in the gaps between interconnects 514 and over interconnects 514 by plasma deposition and/or by spin-on dielectrics, as illustrated in FIG. 5D. Additional levels of metallization and vias are added, if necessary, by repeating the steps depicted.

The methodology depicted above and the many variants known in the art suffer from the limitation that the metallization layer (aluminum 502 in the depicted example) must be etchable with the patterned photoresist in place. In effect, the metallization layer must be etchable at temperatures below approximately 200° C. Above that temperature, conventional polymer photoresists begin breaking down. Plasma or reactive ion etching may be utilized to etch aluminum below that temperature since aluminum reacts with halogens, such as chlorine or fluorine ions, to form a halide which is sufficiently volatile to be removed at low temperatures. Combined with ion bombardment, this reaction allows aluminum to be anisotropically etched to form interconnects with vertical sidewalls.

Metals having lower resistivities, such as copper or silver, do not form sufficiently volatile compounds at temperatures low enough to prevent photoresists from breaking down. Alternative etch processes, such as wet etching, generally produce unsatisfactory results, such as undercutting. Alternative masking processes to etching the conductive material with a photoresist mask, such as "hard" masking with deposited oxide layers, introduce an unreasonable level of additional complexity into the overall process. Thus, conventional processing techniques of the type described above may not be adapted in a satisfactory manner to produce interconnects with lower resistivity metals, particularly with silver. Efforts are currently being directed to developing processes for forming interconnects with copper, since silver is more expensive and less malleable than copper. Additionally, problems with silver migration in the presence of moisture are known in the art, making the use of silver unreliable.

It would be desirable to provide a processing method, and a resulting structure, which would permit the use of low resistivity metal interconnects in an integrated circuit. It would further be desirable for a method producing such low resistivity metal interconnects to be compatible with presently available processing techniques, and to be available without significantly adding to processing complexity.

SUMMARY OF THE INVENTION

Silver interconnects are formed by etching deep grooves into an insulating layer over the contact regions, exposing portions of the contact regions and defining the interconnects. The grooves are preferably etched with a truncated V- or U-shape, wider at the top than at any other vertical location, and have a minimum width of 0.25 $\mu$m or less. An optional adhesion layer and a barrier layer are sputtered onto surfaces of the groove, including the sidewalls, followed by sputter deposition of a seed layer. Where aluminum is employed as the seed layer, a zincating process may then be employed to promote adhesion of silver to the seed layer. The groove is then filled with silver by plating in a silver solution, or with silver and copper by plating in a copper solution followed by plating in a silver solution. The filled groove which results does not exhibit voids ordinarily resulting from sputter deposition of metal into such narrow, deep grooves, although seams may be intermittently present in portions of the filled groove where metal plated from the opposing sidewalls did not fuse flawlessly at the point of convergence. Portions of the silver and other layers above the insulating material are then removed by chemical-mechanical polishing, leaving a silver interconnect connected to the exposed portion of the contact region and extending over adjacent insulating regions to another contact region or a bond pad. Silver interconnects thus formed may have smaller cross-sections, and thus a greater density in a given area, than conventional metallic interconnects.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention. Moreover, although the exemplary embodiment described herein illustrates the present invention as applied to contacts, the same processing techniques may also be applied to formation of interconnects and vias at levels of metallization above the first level.

Figure 1A:
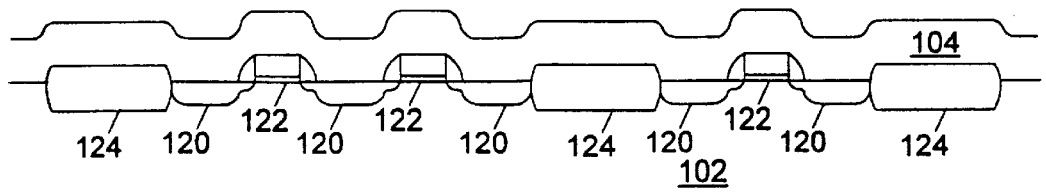
FIGS. 1A–1H depict cross-sections for a process of forming silver interconnects in accordance with a preferred embodiment of the present invention.
Figure 1B:
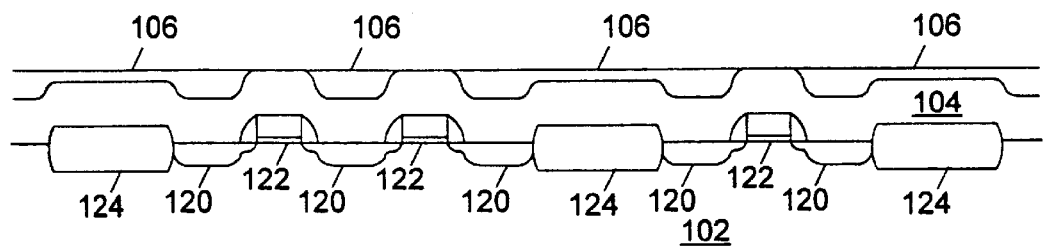
Figure 1C:
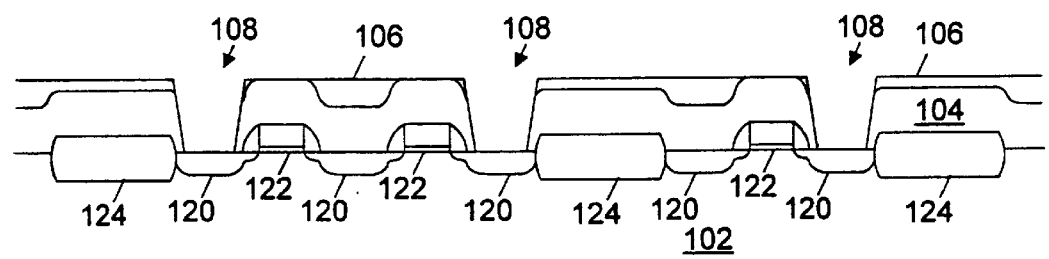
Figure 1D:
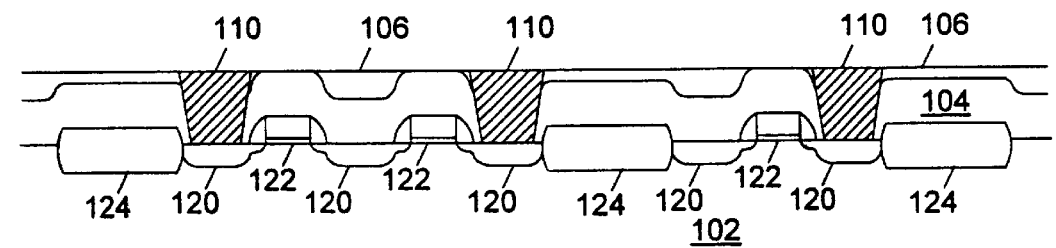

FIGS. 1A through 1H depict cross-sections for a process of forming silver interconnects in accordance with a preferred embodiment of the present invention. The process begins with a plurality of devices having source/drain regions 120 and gates 122 and separated by isolation oxides 124, formed in substrate 102 as illustrated in FIG. 1A. An insulating layer 104 is formed over the devices and isolation regions, such as by depositing an undoped silicon oxide. A planarizing insulating material 106, for example, spin-on-glass, may then be formed as depicted in FIG. 1B to form a more planar upper surface for formation and patterning of subsequent layers. Insulating layers 104 and 106 are then selectively etched to form contact holes 108, illustrated in FIG. 1C, exposing contact regions for devices within substrate 102. Contact holes 108 are then filled with conductive material, for example, tungsten, to form conductive plugs 110 as depicted in FIG. 1D, which will electrically connect the contact regions of devices within substrate 102 to subsequently formed interconnects.

The processes for completing the steps illustrated in FIGS. 1A through 1D are well-known to those skilled in the art. Interconnects connecting conductive plugs 110 to other devices or input/output pads are subsequently formed by a "damascene" or groove-filling process depicted in FIGS. 1E through 1H. In the damascene process, long used to inlay precious metals in the fabrication of jewelry, a trench is formed and filled with a metal, then polished flush to form a smooth surface. As adapted for application in the semiconductor industry, the damascene method entails covering the substrate surface, including transistors and other devices formed on the wafer, with a dielectric layer such as oxide. A patterned photoresist is then formed using high-resolution photolithography, the resist including holes where contacts or vias are to be formed and elongated openings defining interconnect lines. The dielectric is then etched, masked by the resist, to form grooves. These grooves are filled with metal by depositing a metal layer, and the metal layer is etched back to leave a conductive wiring pattern within the dielectric grooves separated by dielectric in the interwiring spaces.

Figure 1E:
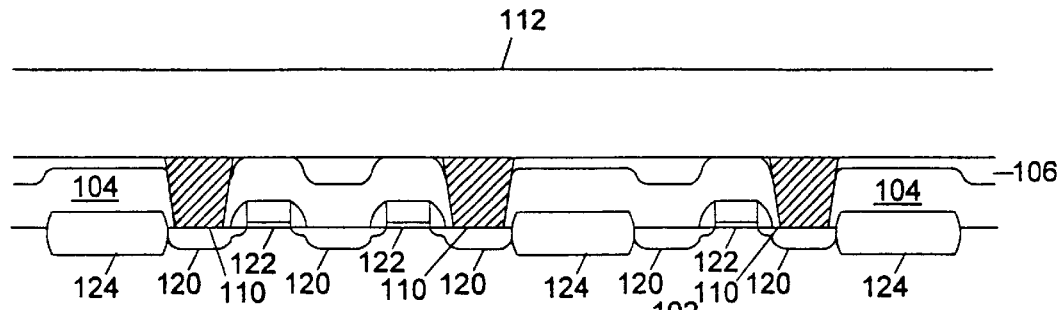
Figure 1F:
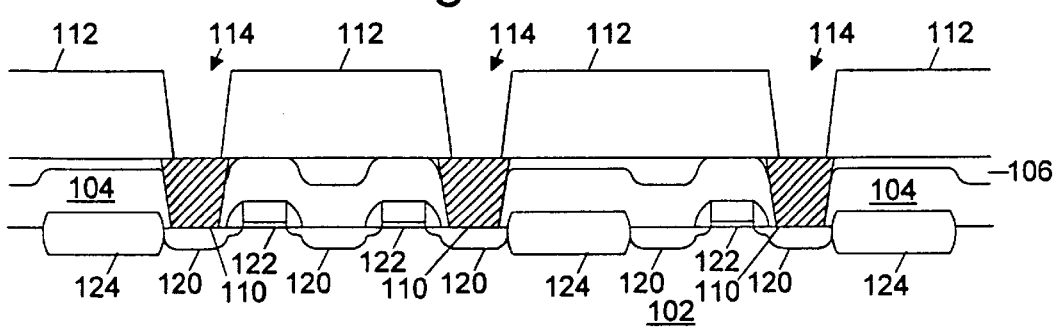

An insulating layer 112 is formed over substrate 102, on insulating layers 104 and 106 and conductive plugs 110, as illustrated in FIG. 1E. Insulating layer 112 may be, for example, an undoped, deposited oxide. Insulating layer 112 is then patterned and selectively etched to form grooves 114, as depicted in FIG. 1F. Grooves 114, shown in their smallest cross-section in FIG. 1F, expose a portion of conductive plugs 110 and extend over insulating layers 104 and 106 from one conductive plug to another conductive plug contacting a different device or an input/output pad, defining the paths of the interconnects which will be formed within grooves 114. Grooves 114, in their narrowest portions of the cross-section, have a width of less than 0.25 $\mu$m, and preferably approximately 0.18 $\mu$m, and height-to-width aspect ratios of at least 2-to-1, and preferably on the order of 3-to-1 or 4-to-1, up to or exceeding 5-to-1. Grooves 114 have a truncated V- or U-shaped cross-section.

Figure 1G:
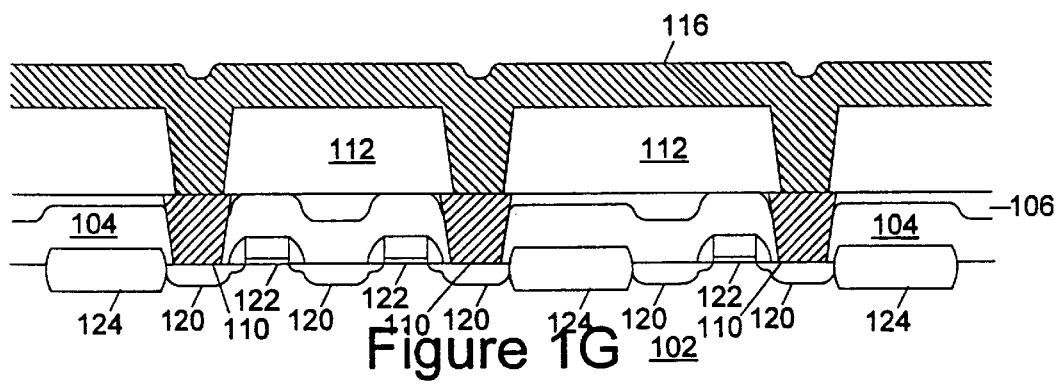
Figure 1H:
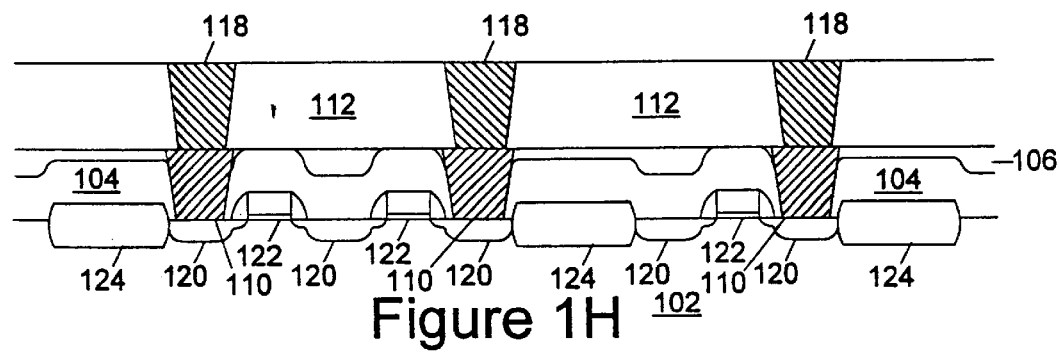

A conformal layer of silver 116 is then formed by plating over insulating layer 112 and within grooves 114, as illustrated in FIG. 1G, filling grooves 114. Either electroplating, in which an electrode is connected to substrate 102, or electroless plating may be utilized. Portions of silver layer 116 above insulating layer 112 are then removed, such as by chemical-mechanical polishing (CMP), as depicted in FIG. 1H. This leaves silver interconnects 118 within grooves 114 between adjacent portions of insulating material 112. The resultant interconnects, formed by CMP removal of upper portions of silver layer 116 above insulating layer 112, will have a substantially planar upper surface. Since the resistivity of silver is significantly lower than aluminum, the minimum width of interconnects 118 is limited only by the minimum line widths of commercial photolithographic processes suitable for patterning insulating layer 112, plus any additional width resulting from etching grooves 114 within insulating layer 112. This allows interconnects with a narrower cross-section to be formed, and also permits a higher density of interconnects within a given area.

Figure 2A:
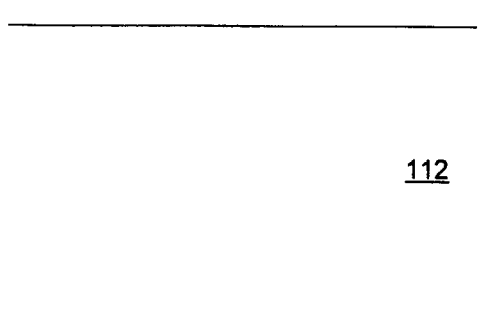
FIGS. 2A–2G are cross-sections for a process for forming silver interconnects in accordance with an exemplary embodiment of the present invention.
Figure 2B:
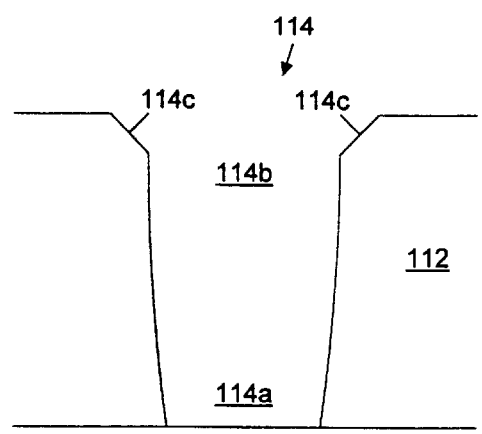

Referring now to FIGS. 2A through 2G, cross-sections illustrating a process for forming interconnects in accordance with an exemplary embodiment of the present invention are shown. In the process depicted, a substantially conformal silver layer is formed over a grooved insulating layer and within the grooves by plating, as illustrated above in FIG. 1G. The process begins, as depicted in FIG. 2A, by formation of insulating layer 112 over a substrate as previously described. Insulating layer 112 may be an oxide formed, for example, by oxidation of tetraethylorthosilicate (TEOS) in accordance with the known art, or by other deposition techniques.

Insulating layer 112 is patterned and etched to form groove 114 having a minimum width—that is, the width at the narrowest point of the cross-section cutting across the breadth of groove 114—of 0.25 μm or less. The minimum width of groove 114 which is suitable for the present invention is limited by the ability to etch trenches or groove 114 within insulating layer 112 to the desired width. Groove 114 preferably has a minimum width of approximately 0.18 μm or less. Groove 114 is a "deep" groove, i.e., having a height-to-width aspect ratio in excess of 2-to-1 and preferably of at least approximately 4-to-1. Groove 114 defines the path of the silver interconnect which will be subsequently formed. Accordingly, groove 114 may be etched to run for a substantial distance across, or for the entire length of, a die containing the integrated circuit for which interconnects are desired, and may include changes in lateral direction as necessary. One or more sections of groove 114 may expose a contact region within the substrate below insulating layer 112.

Groove 114 in accordance with the present invention is preferably etched with a truncated V- or U-shaped cross-section, with the top of the cross-section being wider than the bottom. Conventional interconnects formed patterning and etching aluminum layers as described earlier are typically wider in a middle portion of the cross-section than at the top or bottom portions of the cross-section. In the present invention, however, groove 114 is preferably narrowest at a bottom portion 114a, and slightly wider at a top portion 114b. For example, if groove 114a is 0.25 μm wide at the narrowest, bottom portion 114a, the groove width may be approximately 0.30 μm at the top portion 114a, without being any wider in the intervening portions. The lip 114c of groove 114 may be "battered" or sloped, as illustrated in the exemplary embodiment. Suitable processes for forming grooves having the indicated features and dimensions are known in the art and may include, for example, an anisotropic etch followed by an isotropic etch.

Figure 2C:
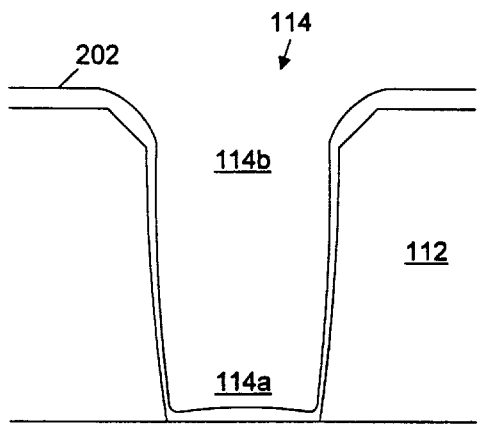
Figure 2D:
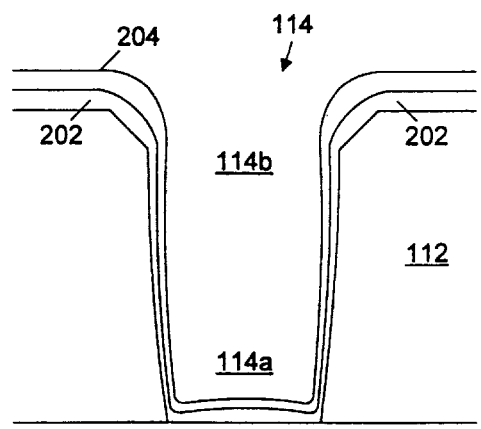

Following formation of groove 114 defining the interconnect path, an optional adhesion layer 202 may be formed over insulating layer 112 and on the sidewalls and bottom of groove 114, as depicted in FIG. 2C. Adhesion layer 202 is preferably reactively sputtered titanium (Ti), although tantalum (Ta) or other suitable materials selected to promote adhesion between insulating layer 112 and subsequently formed layers may be employed. Adhesion layer 202 is preferably formed to a thickness of at least approximately 200 to 300 Å. Although a thinner adhesion layer may be sufficient to promote adhesion as desired, sputter deposited layers suffer from a well known line-of-sight limitation which results in the deposited material being thinner on surfaces which are, at least to some extent, parallel to the direction in which the sputtered material travels, and relatively thicker on surfaces substantially perpendicular to that direction. Thus, adhesion layer 202 may be thinner on the sidewalls of groove 114 than on the bottom of groove 114 or on the upper surface of insulating layer 112. Formation of adhesion layer 202 to a thickness of up to about 300 Å provides some level of certainty that the sidewalls of groove 114 will be covered with an adequate thickness. Thicker layers are undesirable as unnecessarily filling a portion of the limited width of groove 114.

Following formation of adhesion layer 202 (if formed), a barrier layer 204 is formed over adhesion layer 202 above insulating layer 112 and on the surfaces within groove 114, including the sidewalls as well as the bottom. Barrier layer 204 prevents subsequently formed metallic materials from contaminating insulating layer 112. Barrier layer 204 is preferably titanium nitride (TiN) reactively sputtered on top of adhesion layer 202, although other suitable barrier materials such as tantalum nitride (TaN), silicon nitride (SN), or titanium silicon nitride (TiSN) may alternatively be employed. For the reasons described above with respect to sputtered adhesion layer 202, barrier layer 204 is preferably formed to a thickness of at least approximately 200 to 300 Å.

Figures 2E, 2F:
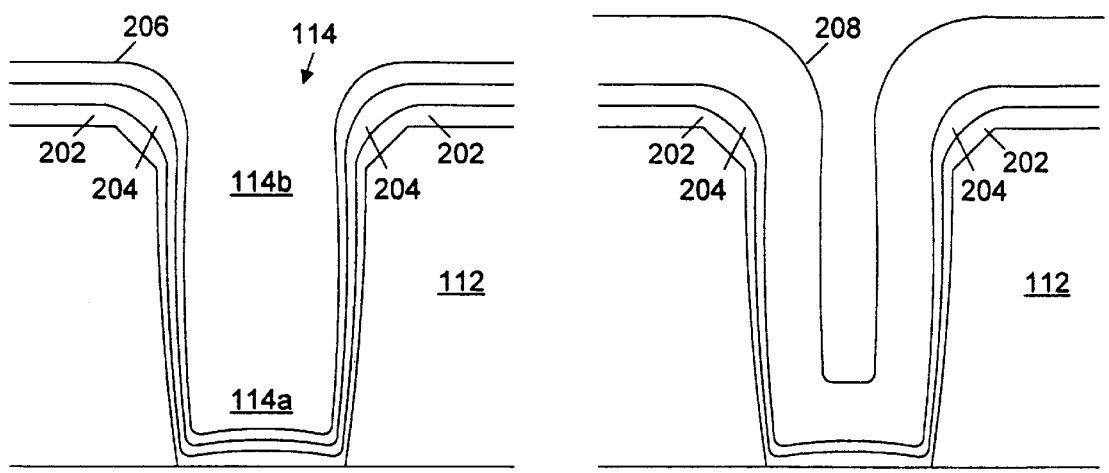

After formation of barrier layer 204 over insulating layer 112 and within groove 114, a seed layer 206 is formed over barrier layer 204 as illustrated in FIG. 2E. Seed layer 206 is a conductive, preferably metallic layer to which an electrode is connected for the electroplating processes described below. In the exemplary embodiment, seed layer 206 is preferably sputter deposited silver. Like adhesion layer 202 and barrier layer 204, and for similar reasons, seed layer 206 is preferably formed to a thickness of at least about 200 to 300 Å. Although thicker seed layers may readily be formed by sputter deposition, it is desirable to avoid filling groove 114 to any unnecessary degree. Sputter deposition, which suffers from the limitations described above, may form thicker silver layers over the groove sidewalls in upper portion 114b of groove 114 than in lower portion 114a. Other processes, such as electroplating as described in further detail below, form silver layers on the sidewalls of groove 114 with uniformly increasing thickness in both upper and lower portions 114b and 114a, creating less likelihood that voids will result within the body of the filled groove/interconnect. Furthermore, sputter deposition consumes a disproportionate amount of expensive silver material in forming a given layer thickness, with a lower recovery or reclamation rate, and thus is inefficient when compared to other methods of forming silver within groove 114, such as the electroplating processes described below.

Figure 2G:
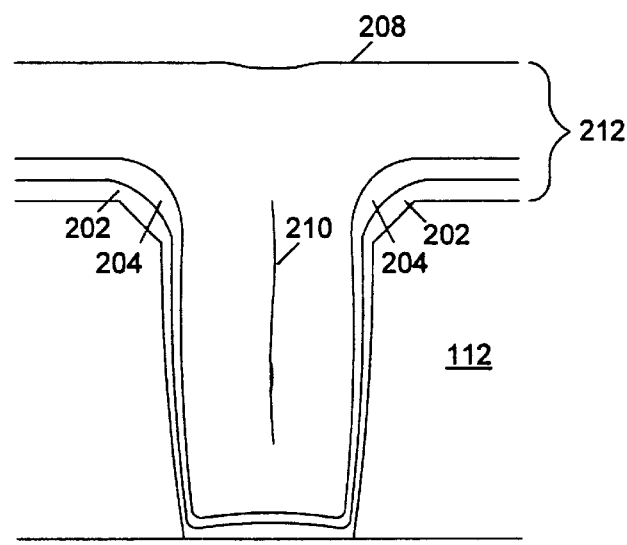

After formation of seed layer 206, a conformal silver layer 208 is formed over insulating layer 112 and within groove 114 by plating, as depicted in FIGS. 2F and 2G. An electroplating process is preferably employed. In an example of a suitable electroplating process, an anode is connected to seed layer 206, with the cathode immersed in a silver solution. The substrate is immersed in one or two—preferably two—strike baths (short duration immersions) for a period of approximately 10 seconds for each strike bath. Both strike baths employ an immersion solution containing between 1 and 5.3 g/l (grams/liter) of silver cyanide and between 67.5 and 90 g/l of sodium cyanide at a temperature of approximately 27° C., with a current density of approximately 1.5–2.5 A/dm$^2$ at 6 volts being passed between the electrodes through the solution. The substrate is then immersed in a silver solution containing approximately 30 g/l of silver cyanide, 56 g/l of potassium cyanide, 45 g/l of potassium carbonate, and 41 g/l of free potassium cyanide at a temperature of 27° C. with a current density of 0.5 A/dm$_2$. The substrate remains immersed until the desired thickness of silver is obtained.

During the electroplating process described, silver "grows" from seed layer 206 by the attachment or fusing of silver from the solution to seed layer 206. Since seed layer 206 is also silver in the exemplary embodiment, conformal silver layer 208 simply subsumes the seed layer. Silver layer 208, shown in FIG. 2F at an intermediate stage before groove 114 becomes filled, increases in thickness uniformly over the surface above insulating material 112, the sidewalls of groove 114, and the bottom of groove 114. Silver layer 208 is formed to a thickness at least as great as ½ the maximum width of the unfilled portion of groove 114. A thickness of between approximately 0.2 to 0.3 $\mu$m is more than sufficient in the exemplary embodiment, although a thickness less than about 0.2 $\mu$m may be suitable for silver layer 208 if groove 114 has a minimum width of 0.25 $\mu$m and a maximum width of 0.3 $\mu$m as described above. If groove 114 has a minimum width of 0.18 $\mu$m, a thickness of less than 0.15 $\mu$m is likely to be adequate.

Groove 114 is thus filled by silver plating from the sidewalls and bottom of groove 114 and fusing at the points of convergence, although seams may be intermittently present in portions of the filled groove where metal plated from opposite sidewalls did not fuse flawlessly. Such seams are unlikely to include detectable voids or impact the conductivity of the interconnect to be formed from the filled groove. The interconnect will be formed by removal of the portions 212 of silver layer 208, barrier layer 204, and adhesion layer 202 above the upper surface of insulating layer 112, for example, by CMP, leaving the portion of silver layer 208 filling groove 114 as the interconnect. This interconnect will have a lower resistivity than conventional metallic interconnects, and therefore may have the dimensions described above without effecting the voltages required for driving signals on the interconnect. Interconnects formed of aluminum, which has a resistivity of about 2.7 $\mu\Omega$-cm require larger cross-sections than interconnects utilizing lower resistivity metals, such as copper (1.7–1.8 $\mu\Omega$-cm) or silver (1.2–1.5 $\mu\Omega$-cm).

Silver also has advantages over the use of copper in forming interconnects. For instance, silver is more thermally stable than copper, thus making silver more resistant to oxidation. Although silver migration in the presence of moisture, making use of silver unreliable, is a problem known to those in the art, current semiconductor processing techniques keep moisture out, thus eliminating the problem of silver migration. Silver also has a much slower diffusion rate than copper, thus creating a more reliable contact to a silicon substrate or polysilicon landing pad. Additionally, electromigration is believed to be less of a problem with silver than with copper.

Figures 3A, 3B:
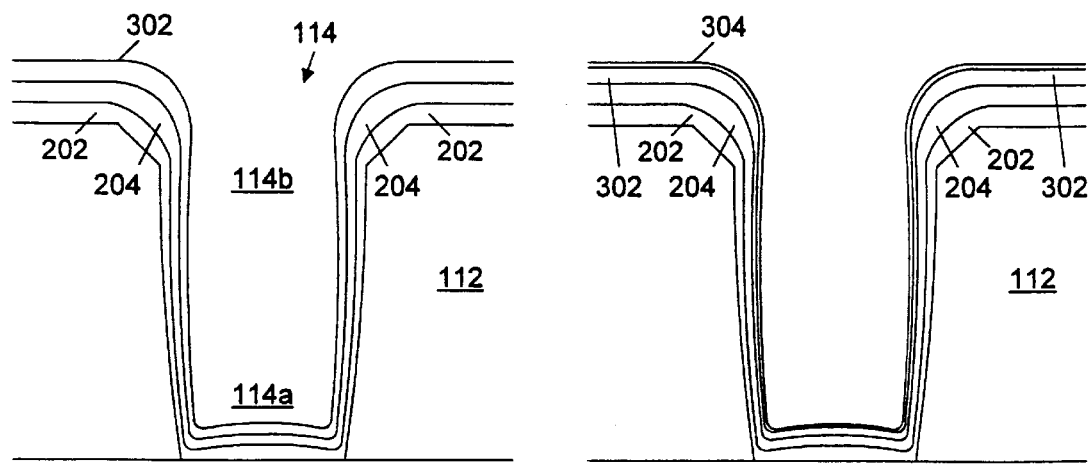
FIGS. 3A–3C depict cross-sections for a process for forming silver interconnects in accordance with an alternative embodiment of the present invention.
Figure 3C:
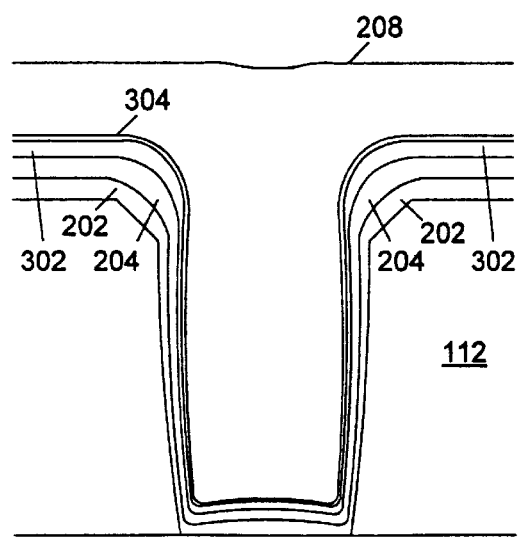

With reference to FIGS. 3A through 3C, cross-sections are depicted for a process for forming silver interconnects in accordance with an alternative embodiment of the present invention. The alternative process follows the process described above up to the point of forming the seed layer before diverging from the process described in connection with FIGS. 2A–2G above. The unique portion of the alternative process thus begins with groove 114 etched into insulating layer 112 and having adhesion layer 202 and barrier layer 204 deposited over insulating layer 112 and on the sidewalls and bottom of groove 114, as depicted in FIG. 3A. Seed layer 302 is sputter deposited over adhesion layer 204 to a thickness of at least about 200 to 300 Å, but in the alternative embodiment seed layer 302 is aluminum rather than silver. Aluminum sputter targets for reactively sputtering aluminum are more readily available than silver sputter targets. Additionally, as described above, sputter deposition of silver is inefficient and poorly suited for recovery or reclamation of silver as compared to other silver deposition processes. Aluminum is much cheaper than silver, so that recovery/reclamation is not a significant concern.

To obtain good adhesion when plating on aluminum, it is usually necessary to start with a pre-coat of zinc or other similar metal (e.g., tin). Plating on aluminum is typically carried out on top of chemically deposited zinc produced by immersion in zincate solutions. Such zincate processes are relatively simple, cheap, and reliable methods for plating on aluminum or aluminum alloys. Zincate processes are less sensitive to alloy composition than alternative processes based on anodizing pre-treatments, and do not require the power necessary for anodizing. Furthermore, zincate processes are significantly less expensive than alternative stannate (tin) processes. A suitable zincate process involves electroless plating through the dissolution of aluminum seed layer 302 and the deposition of zinc layer 304 in its place, as illustrated in FIG. 3B. The basic chemical reaction involves formation of aluminum hydroxide $(Al(OH)_3)$ from aluminum in the anodic reaction and formation of zinc from zinc hydroxide $(Zn(OH)_4)$ in the cathodic reaction. The substrate is immersed in a strong alkaline zincate solution containing zinc hydroxide, normally made up of zinc oxide and caustic soda. The ratio of these constituents may effect the adhesion of subsequently plated material, as may the physical conditions and the time and temperature of the immersion during zincating. The presence of copper in the zincating solution assists adhesion of some alloys during subsequent plating, and substitution of zinc sulphate for zinc oxide may also be beneficial.

The zincating process need only proceed until a small portion of the aluminum is dissolved and replaced by zinc coating 304. Once aluminum seed layer 302 is pretreated to form zinc coating 304, the substrate may then be electroplated using the process described above to form conformal silver layer 208, as depicted in FIG. 3C. Conformal silver layer 208 is formed to a thickness preferably not more than about 0.25 to 0.30 $\mu$m. Formation of conformal silver layer 208 progresses uniformly from seed layer 302 and accompanying zinc coating 304 as described earlier, filling groove 114 without significant potential for bridging or voids within the filled groove 114. Portions of conformal silver layer 208, zinc coating 304, and aluminum seed layer 302 lying above insulating layer 112 are removed, for example, by CMP to leave a silver interconnect within groove 114.

Figure 4A:
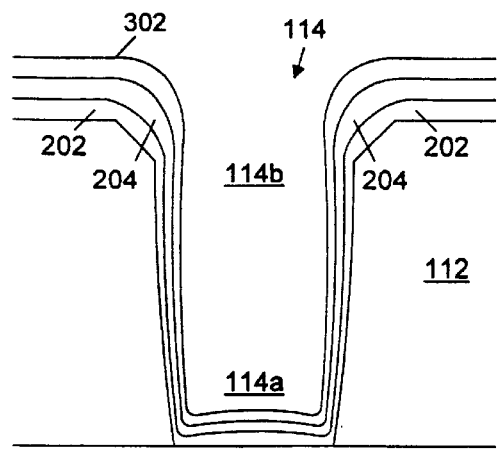
FIGS. 4A–4D are cross-sections for a process for forming copper and silver interconnects in accordance with an alternative embodiment of the present invention.

Referring to FIGS. 4A through 4D, cross-sections illustrating a process for forming copper and silver interconnects in accordance with an alternative embodiment of the present invention are shown. As with the alternative process of FIGS. 3A–3C, the instant alternative process follows the steps described above in connection with FIGS. 2A–2G up to the point of forming the seed layer. The unique portion of the instant alternative process again begins with groove 114 etched into insulating layer 112 and having adhesion layer 202 and barrier layer 204 deposited over insulating layer 112 and on the sidewalls and bottom of groove 114, as depicted in FIG. 4A.

Figure 4B:
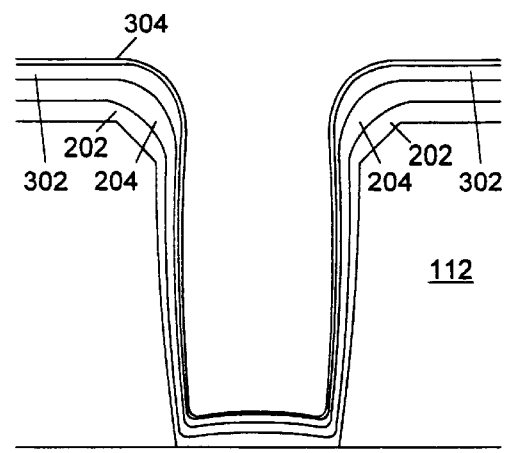
Figure 4C:
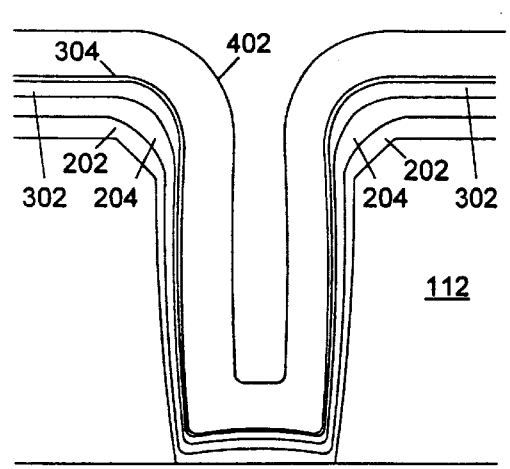
Figure 4D:
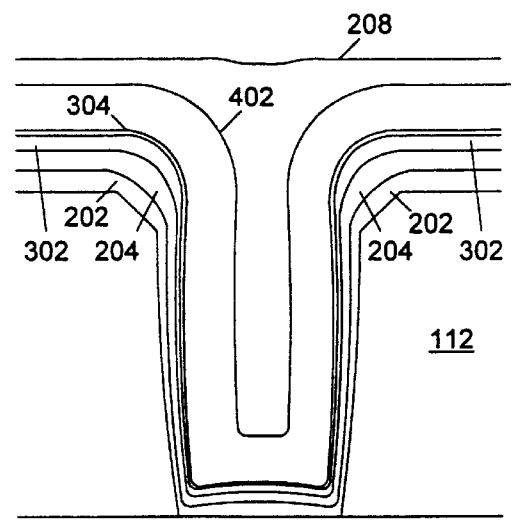
Figure 5A:
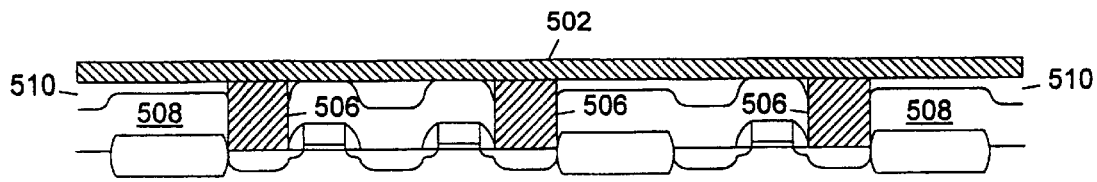
FIGS. 5A–5D are cross-sections for a typical process for forming aluminum metal or aluminum alloy interconnects in accordance with the known art.
Figure 5B:
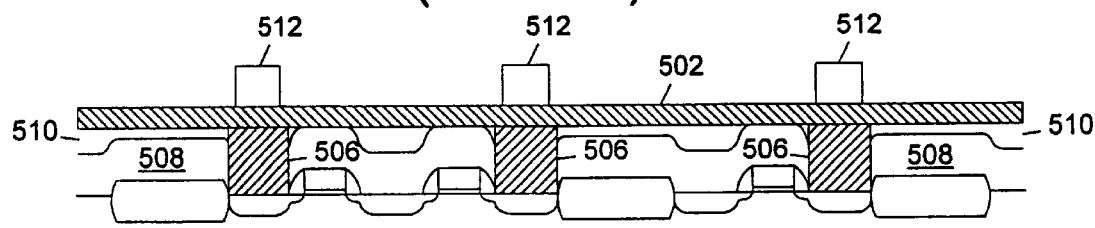
Figure 5C:
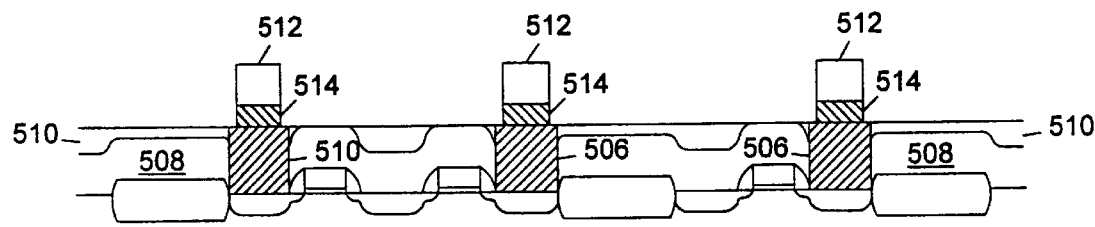
Figure 5D:
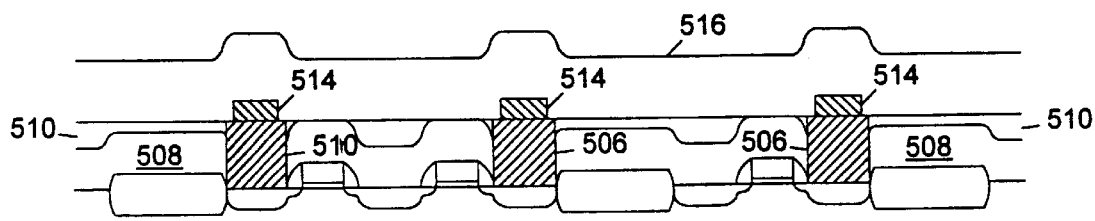

As with the alternative process depicted in FIGS. 3A–3C, an aluminum seed layer 302 is sputter deposited over adhesion layer 204 to a thickness of about 200 to 300 Å, as depicted in FIG. 3A. The zincating process is again employed to pre-treat aluminum seed layer 302, forming zinc coating 304, as illustrated in FIG. 4B. However, the zincating process preferably includes a chelating agent and approximately 6 g/l of copper. In this alternative, the electroplating process to fill groove 114 begins with electroplating in a copper solution to form conformal copper layer 402 over insulating layer 112 and within groove 114, as depicted in FIG. 4C. Copper may be plated directly onto zinc coating 304 using, for example, a cyanide copper solution or a copper pyrophosphate solution. The presence of copper within the alkaline zincating solution as described is desirable where a copper pyrophosphate bath is employed for copper plating. Any increase in the resistivity of the zinc/aluminum/silver interconnect or the zinc/copper/aluminum interconnect should be negligible over the silver interconnect.

A suitable process for copper plating using a copper pyrophosphate solution involves immersion of the substrate in a solution containing approximately 210 g/l of phosphate (as $P_2O_7$), approximately 30 g/l of copper (as Cu), and approximately 3 g/l of ammonia (as $NH_3$). The solution is operated at a temperature of between about 40° C. and 60° C., with a pH between about 7.5 and 8.5, and a current density of approximately 2–4 A/dm$^2$, with air agitation. A tendency for the pH of the solution to rise may occur as a result of drag-in (transfer of constituents) from the zincate solution, but may be corrected by the addition of dilute tartaric acid. High pH may lead to blistering (formation of bubbles) of the deposited copper, as may high free-cyanide content in cyanide copper solutions and high operating temperatures.

While copper has a higher resistivity than silver, it is also less expensive than silver. Interconnects formed with appropriate copper/silver metal combinations may have an acceptable total resistivity. In fact, the resistivity may not be much higher than the resistivity for the silver interconnect, thus, still achieving smaller cross-sections and higher densities than conventional metal (aluminum) interconnects. Thus, conformal copper layer 402 may be formed to a thickness occupying up to, but preferably not exceeding, two-thirds of the space remaining within groove 114 when plating is performed. Thus, for example, if groove 114 is etched with a maximum width of 0.30 μm and adhesion layer 202, barrier layer 204, and aluminum seed layer 302/zinc coating 304 each are formed to a thickness of 200 Å (leaving space having a width of 0.18 μm within groove 114), conformal copper layer 402 may be formed to a thickness of up to about 600 Å. Following formation of conformal copper layer 402, a conformal silver layer 208 is formed by electroplating as described above to fill the remaining space within groove 114. In this alternative, conformal silver layer 208 is formed to a thickness of at least 600 Å where groove 114 is etched with a maximum width of 0.30 μm as previously described, and may be formed to a thickness of 800 to 1,000 Å to insure that groove 114 will be completely filled.

Portions of conformal layer 208, copper layer 402 if any, seed layer 302, barrier layer 204, and adhesion layer 202 which are above the upper surface of insulating layer 112 are preferably removed to leave the metal-filled groove as an interconnect. These portions may be removed by wet etch, dry etch, CMP, or any combination of the processes which may be suitable for a particular process flow.

Although the embodiments described above employ electroplating, electroless plating may also be utilized for forming the conformal silver or copper layers. With electroplating, also referred to as "electrolytic plating," typically larger plated layer thicknesses are formed at sharp edges and corners and thinner thicknesses are formed within shielded areas and recesses using electroplating processes. With electroless plating, the plated layer thickness is generally uniform regardless of the profile geometry of the surface being plated. Thus, the uniformity of the plated layer thickness depends upon both the plating method employed and the profile geometry of the surface being plated. Electroless plating may be employed in the present invention, provided solutions furnishing the appropriate anodic and cathodic reactions are employed. However, electroplating is capable of plating a layer to a desired thickness faster than electroless plating. Furthermore, for the dimensions involved in the present invention, plated layer thickness variations resulting from electroplating are within acceptable tolerances, and should not affect the ability of electroplating to completely fill the etched grooves without bridging or leaving voids within the interconnect body.

The present invention provides a process for forming interconnects with metals having lower resistivity than the aluminum or aluminum alloys conventional employed for interconnects. Thus, interconnects having a smaller cross-sectional area may be formed and still provide satisfactory signal transmission. In turn, smaller cross-sections allow a higher density of interconnects to be formed on an integrate circuit die having a given size. The process of the present invention for forming interconnects is compatible with customary practices for forming other features of an integrated circuit. Thus, lower resistivity interconnects having a higher density may be readily formed on conventional integrated circuits by the present invention.

While the invention has been particularly shown and described with reference to a preferred embodiment, it will be understood by those skilled in the art that various changes in form and detail may be made therein without departing from the spirit and scope of the invention.

What is claimed is:

1. A structure of a portion of an integrated circuit, comprising:
    a dielectric layer over a substrate;
    a groove extending into the dielectric layer from an upper surface of the dielectric layer and defining a path for an interconnect;
    silver filling at least a portion of the groove to form the interconnect; and
    a seed layer comprising aluminum having a zinc coating between sidewalls and a bottom of the groove and the silver.

2. The structure of claim 1, wherein the dielectric layer is oxide.

3. The structure of claim 1, wherein the groove has a truncated V-shaped cross-section.

4. The structure of claim 1, wherein the groove has a minimum width of 0.25 μm.

5. The structure of claim 1, wherein the groove has a minimum width of 0.18 μm.

6. The structure of claim 1, wherein the groove has a maximum width of 0.30 μm.

7. The structure of claim 1, wherein the groove has a height-to-width aspect ratio greater than 2-to-1.

8. The structure of claim 1, wherein the groove extends completely through a thickness of the dielectric layer.

9. The structure of claim 1, wherein the groove is formed over a contact region within the substrate and exposes a portion of the substrate.

10. The structure of claim 1, wherein the silver is formed by electroplating the substrate through immersion in a silver solution while an electrode is connected to the substrate.

11. The structure of claim 1, wherein the silver includes a seam at a point of convergence for silver plated from opposing sidewalls of the groove.

12. The structure of claim 1, further comprising:
    an adhesion layer having a thickness of approximately 200 Å between sidewalls and a bottom of the groove and the silver.

13. The structure of claim 1, further comprising:

a barrier layer having a thickness of approximately 200 Å between sidewalls and a bottom of the groove and the silver.

14. The structure of claim 1, wherein the seed layer has a thickness of approximately 200 Å.

15. The structure of a portion of an integrated circuit, comprising:

an oxide over a substrate including a contact region;

a groove extending through the oxide at least in part over the contact region, exposing a portion of the contact region and defining a path for an interconnect;

silver filling at least a portion of the groove to form the interconnect; and an aluminum seed layer with a zinc coating having a combined thickness of approximately 200 Å between the oxide and the silver.

16. The structure of claim 15, wherein the groove has a minimum width of about 0.25 μm or less.

17. The structure of claim 15, wherein the groove is a deep groove having a height-to-width aspect ratio greater than 2-to-1.

18. The structure of claim 15, wherein the groove has a truncated V-shaped cross-section.

19. The structure of claim 15, wherein the silver has a seam at a point of convergence for silver plated from opposing sidewalls of the groove.

20. The structure of claim 15, further comprising:

a titanium adhesion layer having a thickness of approximately 200 Å on the sidewalls of the groove between the oxide and the seed layer and on a bottom of the groove between the substrate and the seed layer; and a titanium nitride barrier layer having a thickness of approximately 200 Å between the adhesion layer and the seed layer.

21. The structure of claim 20, further comprising:

copper layer between the zinc-coated seed layer and the silver.

22. The structure of claim 21, wherein the cooper layer has a thickness of approximately 600 Å.

23. An intermediate structure of a portion of an integrated circuit, comprising:

an oxide over a substrate including a contact region;

a groove extending through the oxide at least in part over the contact region, exposing a portion of the contact region and defining a path for an interconnect;

silver over the oxide and within the groove, filling at least a portion of the groove to form the interconnect; and an aluminum seed layer with a zinc coating having a combined thickness of approximately 200 Å between the oxide and the silver.

24. The structure of claim 23, wherein the groove has a truncated V-shaped cross-section with a minimum width of about 0.25 μm or less and a height-to-width aspect ratio greater than 2-to-1.

25. The structure of claim 23, wherein the silver has a seam at a point of convergence for silver plated from opposing sidewalls of the groove.

26. The structure of claim 25, further comprising:

a titanium adhesion layer having a thickness of approximately 200Å on the sidewalls of the groove between the oxide and the seed layer and on a bottom of the groove between the substrate and the seed layer;

a titanium nitride barrier layer having a thickness of approximately 200 Å between the adhesion layer and the seed layer; and a copper layer having a thickness of approximately 600 Å between the zinc-coated seed layer and the silver.

\* \* \* \* \*